United States Patent
Koiwa et al.

(10) Patent No.: US 6,403,160 B1
(45) Date of Patent: Jun. 11, 2002

(54) FERROELECTRIC THIN FILM, PRODUCTION METHOD THEREOF AND COATING LIQUID FOR MAKING THIN FILM

(75) Inventors: Ichiro Koiwa; Juro Mita; Takao Kanehara, all of Tokyo; Akira Hashimoto; Yoshihiro Sawada, both of Yokohama, all of (JP)

(73) Assignees: Oki Electric Industry Co., Ltd., Tokyo; Tokyo Ohka Kogyo, Co., Ltd., Kanagawa, both of (JP)

( * ) Notice: Subject to any disclaimer, the term of this patent is extended or adjusted under 35 U.S.C. 154(b) by 0 days.

(21) Appl. No.: 09/389,484

(22) Filed: Sep. 3, 1999

Related U.S. Application Data

(62) Division of application No. 08/768,293, filed on Dec. 17, 1996, now Pat. No. 5,976,705.

(30) Foreign Application Priority Data

Dec. 20, 1995 (JP) .............................................. 7-331698

(51) Int. Cl.⁷ .............................. B05D 3/02; C04B 35/00
(52) U.S. Cl. ..................... 427/376.2; 427/226; 427/240; 252/62.9 R; 252/62.9 Z
(58) Field of Search ................ 427/376.2; 106/1.25; 252/62.9 R, 62.9 Z

(56) References Cited

U.S. PATENT DOCUMENTS

| | | | | |
|---|---|---|---|---|
| 5,279,996 A | * | 1/1994 | Hase et al. | 501/136 |
| 5,976,705 A | * | 11/1999 | Koiwa | |
| 6,140,746 A | * | 10/2000 | Miyashita et al. | 310/358 |

OTHER PUBLICATIONS

Ceramics vol. 30, No. 6, pp. 499–507 (1995).

* cited by examiner

*Primary Examiner*—Deborah Jones
*Assistant Examiner*—Stephen Stein
(74) *Attorney, Agent, or Firm*—Wenderoth, Lind & Ponack, L.L.P.

(57) ABSTRACT

An object of the present invention is to reduce a leakage current of a Pb Zr Ti O base ferroelectric thin film when a voltage is applied. A ferroelectric thin film comprising a composition of $PbZr_xTi_{1-x}Sb_yO_3$ (where $0 < x < 1$, $0.0001 \leq y \leq 0.05$) is provided herein as well as a method of producing it. The presence of the Sb serves to reduce the leakage current of the film when a voltage is applied.

11 Claims, 5 Drawing Sheets

FIG_1
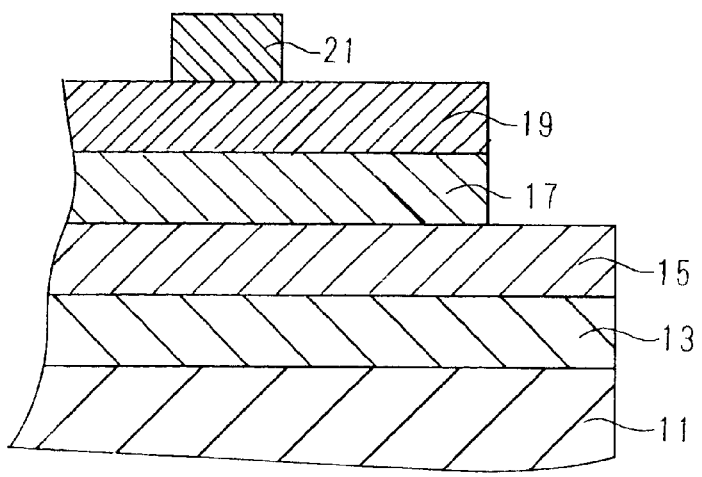

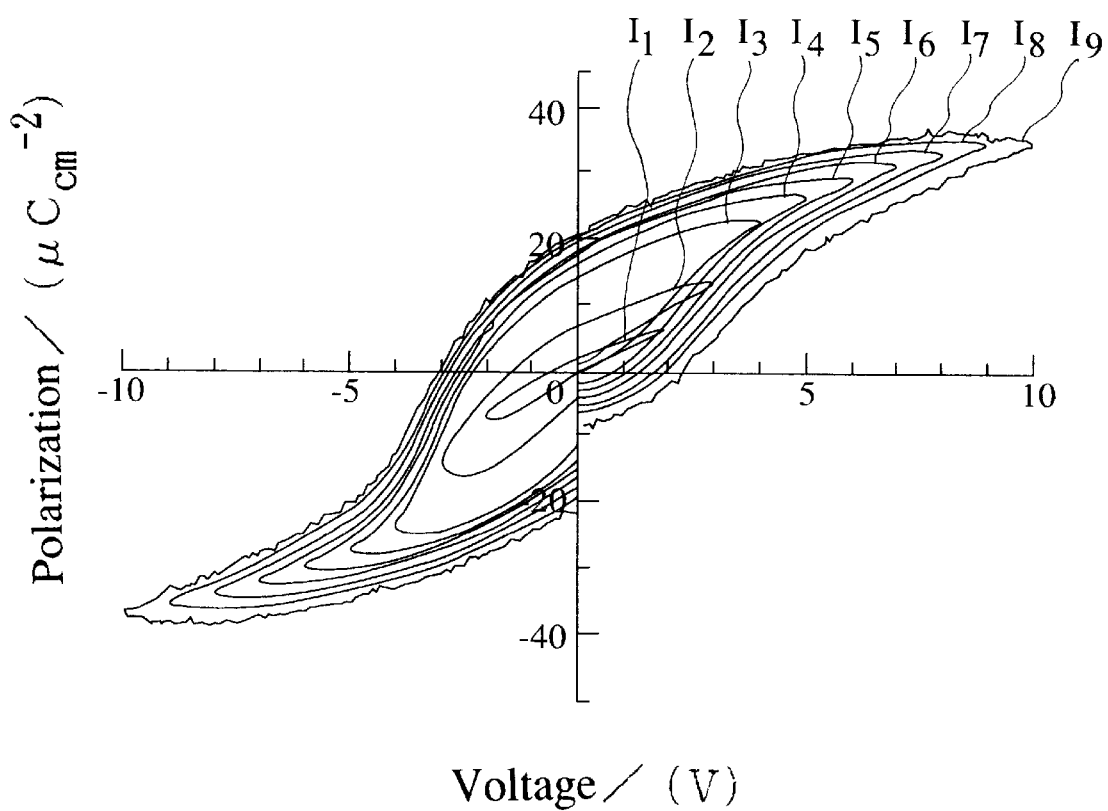
FIG_2

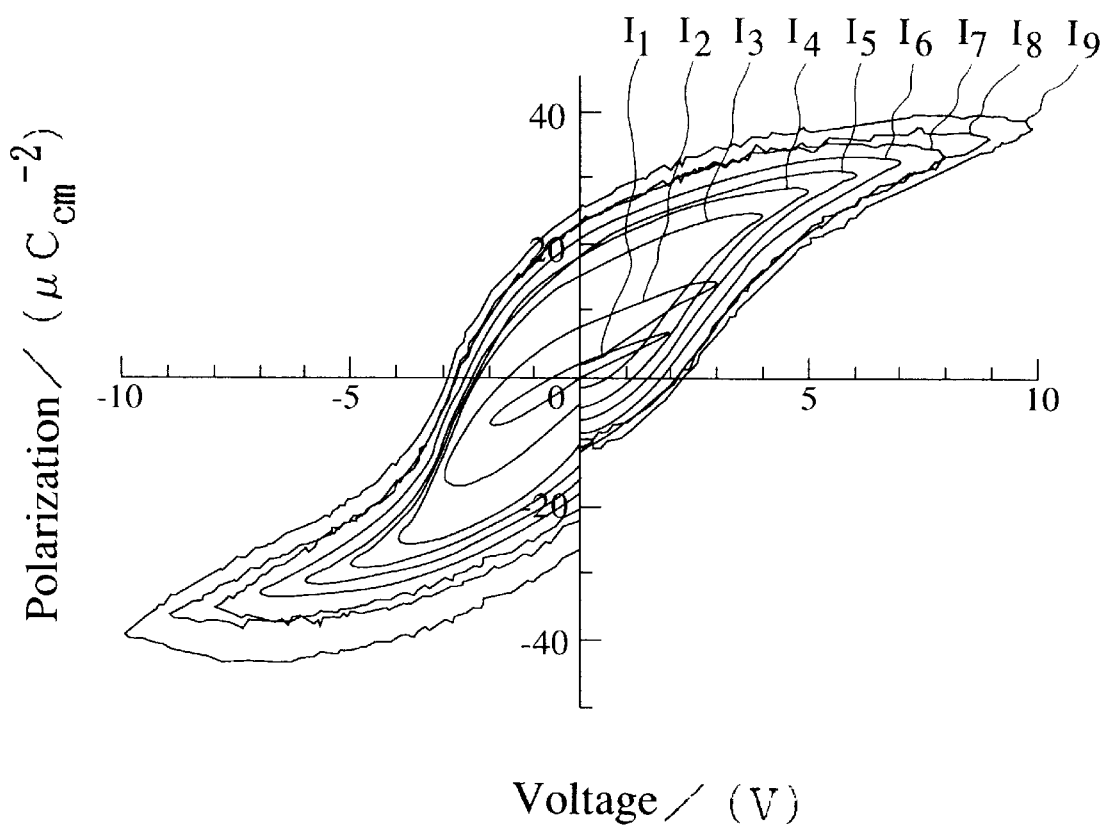
FIG_3

● : No. 1 sample (0.5 mol % addition)
▲ : No. 2 sample (1.0 mol % addition)
○ : No. 3 sample (comparative example)

● : No.1 sample (0.5 mol % addition)
▲ : No.2 sample (1.0 mol % addition)
○ : No.3 sample (comparative example)

FERROELECTRIC THIN FILM, PRODUCTION METHOD THEREOF AND COATING LIQUID FOR MAKING THIN FILM

This application is a divisional application of Ser. No. 08/768,293 filed Dec. 17, 1996, now U.S. Pat. No. 5,976, 705.

BACKGROUND OF THE INVENTION

1. Field of the Invention

The present invention relates to a ferroelectric thin film containing lead (Pb), a method of producing said thin film and a coating solution for making the ferroelectric thin film.

2. Description of the Related Art

A ferroelectric thin film has received attention in recent years, since it is expected that the ferroelectric thin film can be applied to the production of semiconductor memory devices and the like. (For example, attention is directed to literature I: Ceramics Vol. 30, No. 6, pp. 499–507 (1995)). In this respect, studies on a ferroelectric thin film of a composition of $PbZr_xTi_{1-x}O_3$ (0<x<1, hereinafter referred to as "PZT") have been particularly carried out. For making the PZT thin film, several methods, such as a sputtering method, a CVD method, a wet method or the like, have been tried. Since the wet method does not use a vacuum system, it is superior in the points that it can reduce the cost of making the thin film and mass-producing it and it is capable of producing a thin film on a large area. According to the wet method, a coating solution for making the ferroelectric thin film is applied on a substrate and then is baked to produce the desired thin film. A coating solution for making the PZT thin film is manufactured by a so-called sol-gel method in many cases.

There is a problem, however, in that a large leakage current tends to flow through the prior art PZT thin film. In particular, there is a problem in the thinner film thickness range (i.e. in a range of not more than 0.3 µm) in that the dielectric withstand voltage of the film deteriorates in addition to the increased leakage current. These problems are caused by the lead (Pb) loss in the thin film. Moreover, the PZT film made by the wet method in particular tends to possess these problems. This is thought to be due to the occurrence of lead loss in the baking process. To solve this problem, there has been proposed a method of adding excessive lead in advance in amounts equivalent to the loss (a few %). But even in this case, the thin film is in such a state that it is deficient in lead in close proximity to the surface thereof. Further, if lead is added in excessive amounts to avoid this state of lead deficiency, the electrical conductivity of the film is increased; thus, the leakage current is increased. It is thought that not only PZT thin films but also other various kinds of ferroelectric thin films containing Pb will produce this problem.

Accordingly, it is desirable to produce a ferroelectric thin film containing Pb and with a smaller leakage current than was previously possible and a process of making such film, as well as a coating solution for producing the thin film.

SUMMARY OF THE INVENTION

With a view to correcting the above deficiencies there is provided, according to a first aspect of the present invention, a ferroelectric thin film containing Pb, comprising antimony (Sb) present in sufficient quantities to compensate for a change of the thin film into a p-type film caused by the Pb defects generated in the thin film. If such a quantity of Sb is added in the ferroelectric thin film containing Pb, even if bivalent Pb is dispersed during the process of manufacturing the ferroelectric thin film, thus producing Pb defects in the thin film, the trivalent Sb compensates for such Pb defects. The ferroelectric thin film might slightly become a p-type film, even with the addition of Sb, however, it maintains its insulation properties, thereby restraining the occurrence of leakage current.

In accordance with a second aspect of the present invention, there is provided a method for making a ferroelectric thin film containing lead on a substrate by a wet method, which method comprises the steps of:

adding in advance in a coating solution used for making a ferroelectric thin film, antimony (Sb) in such quantities as to compensate for a change of the thin film into p-type that is caused by Pb defects generated in the thin film, and forming a ferroelectric thin film containing lead on a substrate by using a coating solution containing antimony.

According to the foregoing method, the production of a ferroelectric thin film by a wet method is facilitated and the cost of making such film is significantly reduced. This is achieved by adding Sb in advance to the coating solution to produce a ferroelectric thin film containing Pb.

In accordance with a third aspect of the present invention, there is provided a coating solution for making a ferroelectric thin film containing Pb by a wet method, comprising antimony in a range of 0.01–5 mol % based upon 100 mol % of Pb. The reason why the ratio of Sb to Pb is in a range of 0.01–5 mol % is that the addition of Sb in this range reduces the leakage current without segregation of the Sb.

The foregoing and other objects, features and advantages of the present invention will be better understood from the following description taken in connection with the accompanying drawings.

BRIEF DESCRIPTION OF THE DRAWINGS

FIG. 1 is a sectional view illustrating the structure of a sample of a preferred embodiment, FIG. 2 is a P—V hysteresis curve of the No. 1 sample made by using a coating solution containing Sb of 0.5 mol % in relation to Pb for describing the present invention, FIG. 3 is a P—V hysteresis curve of a No. 2 sample made by using a coating solution containing Sb of 1.0 mol % in relation to Pb for describing the present invention.

DETAILED DESCRIPTION OF THE PREFERRED EMBODIMENTS

Figure 4A:
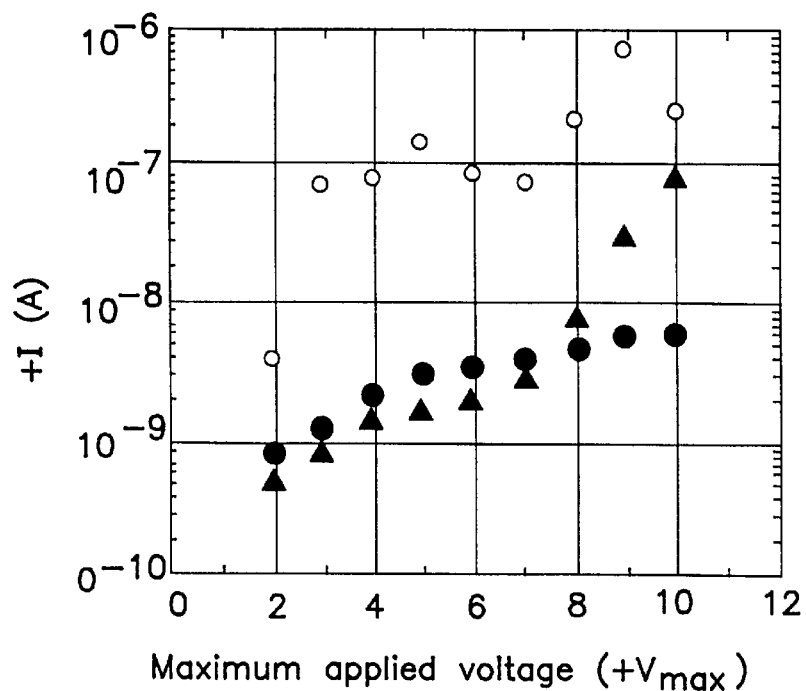
FIG. 4 shows the leakage current characteristics of samples of the preferred embodiments and comparative sample, and (A) and (B) are leakage current characteristics corresponding to the different directions of voltage applied between an upper electrode and a lower electrode.

The preferred embodiments of the present invention will be hereinafter described. However, it must be made clear that the materials used and the numerical conditions employed, such as the quantities of the materials used, the treatment temperatures, the treatment times or the like, are only examples and should not be construed as limiting the present invention.

(1) Description of a Coating Solution and a Method of Producing It

First, a method for making a coating solution is described. Supply sources for the components of the component elements of the ferroelectric thin film are prepared. Thus, the supply source for the lead (Pb) component is lead organic substance, the supply source for the zirconium (Zr) component is zirconium tetra-isopropoxide and the supply source for the titanium (Ti) component is titanium tetra-butoxide, respectively. The lead organic substance, for example, lead (II) acetate tri hydrate $Pb(CH_3COO)_2 \cdot 3H_2O$ of 303.46 g (0.8 mol) is weighed out and then is dissolved in ethylene glycol monomethyl ether $(CH_3OCH_2CH_2OH)$ of 300 g (about 310.5 ml) as a solvent. Next, this solution is heated to a temperature of about 124° C. to dehydrate it.

Next, the solution is naturally cooled and when the temperature of the solution is under 90° C., a zirconium tetra-isopropoxide isopropanol solution (concentration of zirconium tetra-isopropoxide $Zr(OiPr)_4$:77.12 wt. %) of 176.66 g and titanium tetra-butoxide butanol solution (concentration of titanium tetra-butoxide $Ti(OBu)_4$: 99 wt. %) of 132.01 g are added to the solution. The solution is then heated at a temperature of 120–122° C. and is then naturally cooled to room temperature. According to this procedure, a first liquid containing 0.8 mol of $Pb(Zr_{0.52}Ti_{0.48})O_3$ of 500.00 g is produced.

Aside from the first liquid, a second liquid containing the Sb component as a component element of the ferroelectric thin film to be produced is made by the following process. A lead organic substance, for example, lead (II) acetate tri hydrate of 72.83 g (0.192 mol) is weighed out and then is dissolved in ethylene glycol monomethyl ether of 72.00 g (about 74.5 ml) as a solvent. Next, this solution is heated to a temperature of about 124° C. to dehydrate it. The solution is then naturally cooled and when the temperature of the solution is under 90° C., antimony triethoxide $Sb(OEt)_3$ of 49.33 g (0.192 mol) is added to the solution. The solution is then heated at a temperature of 120–122° C. and then is cooled naturally to room temperature. The second liquid containing 0.192 mol each of the Sb element and the Pb element (contained in a form of Pb—O—Sb metalloxy bond) of 123.97 g is produced by this process.

The first liquid is then mixed with the second liquid at an adjusted ratio to produce a coating solution for making a thin film containing specified amounts of Sb based on the amount of Pb. In this embodiment, a first coating solution containing Sb of 0.5 mol % in relationship to the amount of Pb and a second coating solution containing 1.0 mol % Sb to Pb are prepared, respectively. In this regard, a first liquid of 102.5 g and a second liquid of 0.53 g are dissolved in solvent, or ethylene glycol monomethyl ether, of 328.00 g (about 339.4 ml) so as to make the first coating solution. Since the first liquid of 102.5 g contains 0.164 mol of Pb (102.5×0.8/500= 0.164) and the second liquid of 0.53 g contains Sb and Pb in amounts of 0.00082 mol (0.53=0.192/123.97=0.00082), the coating solution contains a Pb to Sb ratio such that Sb/Pb= 0.00082/(0.164+0.00082) 0.5 mol %. Moreover, a first liquid of 102.5 g and a second liquid of 1.06 g are dissolved in a solvent, or ethylene glycol monomethyl ether, of 328.00 g (about 339.4 ml) so as to make the second coating solution.

The solutions made by the processes described above are heated to a temperature of 120–124° C., and are refluxed for five hours in a heated state, respectively. Next, a mixed solution made by mixing ethylene glycol monomethyl ether of 41.00 g (about 42.4 ml) with $H_2O$ of 5.90 g (0.328 mol) is dripped in each solution, respectively, while being stirred, so as to hydrolyze it. The solutions are then stirred for four hours. This process produces a first coating solution containing Sb in a ratio of 0.5 mol % in respect to the Pb and a second coating solution containing gb in a ratio of 1 mol % based on the Pb, respectively. The solid substance of the first coating solution is 11.09 wt % and the solid substance of the second coating solution is 11.10 wt %.

Moreover, in this embodiment, a coating solution for making a thin film of lead titanate ($PbTiO_3$) is separately prepared. As will be later described in detail, it is because a $PbZr_xTi_{1-x}Sb_yO_3$ (where x is a value that satisfies the equation 0<x<1 and y is a value that satisfies the equation $0.0001 \leq y \leq 0.05$) thin film associated with the present invention made on a lead titanate ($PbTiO_3$) is superior to the one made on the other thin film.

A lead organic substance, for example, lead (II) acetate tri hydrate of 42.49 g (0.112 mol) is dissolved in ethylene glycol monomethyl ether of 70.00 g (about 72.4 ml) as a solvent. Next, this solution is heated to about 124° C. to dehydrate it. The solution is then naturally cooled and when the temperature of the solution is under 90° C., a titanium tetra-butoxide butanol solution (concentration of titanium tetra-butoxide $Ti(OBu)_4$:99 wt %) of 38.54 g (0.112 mol) is added to the solution. The solution is then heated at the temperature of 120–122° C. and then is naturally cooled to room temperature. The third liquid containing 0.112 mol of $PbTiO_3$ of 127.34 g is produced by this process.

Next, ethylene glycol monomethyl ether of 280 g (about 289.8 ml) is added to a third liquid and then is stirred. In addition, a mixed solution made by mixing ethylene glycol monomethyl ether of 28.00 g (about 29.0 ml) with $H_2O$ of 4.03 g (0.224 mol) is dripped in the liquid, while being stirred, so as to hydrolyze it. Then, the solution is stirred for four hours. This process will produce a coating solution containing $PbTiO_3$ of 0.112 mol for a lead titanate of 439.38 g. The solid substrate (in terms of oxide) of this coating solution is 7.725 wt %.

(2) Description of the Ferroelectric Thin Film

Next, a $PbZr_xTi_{1-x}Sb_yO_3$ thin film (hereinafter referred to as a "PZT thin film containing Sb") is made on a substrate as follows by a wet method using the coating solutions prepared as described above. Referring now to FIG. 1 illustrating a sectional view of a main part, for example, a silicon (Si) substrate 11 is used as a substrate. The substrate 11 is then treated with a heat oxidation treatment to produce a silicon oxide insulation film 13 ($SiO_2$) of 1000 Å in film thickness thereon. Next, a platinum thin film of 600 Å in film thickness, for example, is made on the silicon oxide insulation film with a sputtering method to make a lower electrode 15.

The above described coating solution for the lead titanate is then coated on the lower electrode with a spin coating method, and dried in an oven at a temperature of 150° C. in the atmosphere for 15 minutes. Next, it is prebaked at a temperature of 460° C. in the atmosphere for 25 minutes to burn off the organic substance in the thin film. The prebaked thin film is made into a lead titanate (PTO) thin film 17 by a baking thereafter.

The baking is conducted at the same time as the baking in the process for making a PZT thin film containing Sb, as described later is this embodiment. In this regard, the thinner the thickness of PTO thin film, the better it will prevent a decrease in capacitance, if it can play a role as an underlayer of the PZT thin film containing Sb. Therefore, it is recommended that the film thickness of the PTO thin film be 30–1000 Å. In this case, the film thickness is 500 Å.

Accordingly, in this embodiment, the PZT thin film containing Sb is made on the prebaked PTO thin film using the above described first coating solution as follows. (1) The above described coating solution is coated on the PTO thin film 17 on the condition that a substrate is first rotated at a revolution rate of 500 rpm for 5 seconds and then it is rotated at a revolution rate of 2000 rpm for 20 seconds. (2) Next, this coated layer is dried at a temperature of 150° C. for 15 minutes in the atmosphere. (3) This dried coated layer is then prebaked at a temperature of 460° C. for 25 minutes in the atmosphere to burn off organic substances in the thin film.

The steps (1) to (3) described above are repeated four times. Then the coated layer is baked at 650° C. for 1 hour in the atmosphere, which process is known as the baking to make a PZT thin film 19 containing Sb of a film thickness of 3000 Å on a PTO thin film 17. When the baking process is carried out for a PZT thin film, the baking is also carried out at the same time for the PTO thin film. In this regard, it is desirable that the film thickness of the PZT thin film 19 containing Sb is more than 1500 Å from the viewpoint of insulation performance and the above-described film thickness of 3000 Å is only one example. The reason why the substrate is rotated at a low revolution rate at first and then is rotated at a high revolution rate in the spin coating process (1) is that the coating solution for making the PZT thin film containing Sb conforms to the substrate at first and then the excessive coating solution is splashed off during rotation at a high speed to make the thin film. The reason why the processes from (1) to (3) are repeated is that the film tends crack if a final desired film thickness is made only one time.

In order to evaluate the PZT thin film containing Sb, which is made using a coating solution according to the present invention, upper electrodes are made to make samples for evaluation. In this embodiment, circular upper electrodes 21 comprising a platinum thin film of 3000 Å in film thickness and 0.2 mm in diameter were made on the PZT thin film 19 containing Sb by a sputtering method and a well known patterning technique. Moreover, a PZT thin film containing Sb was made by using the second coating solution as in the case of the first coating solution described above to obtain samples for evaluation. In this regard, the sample made by using the first coating solution is made into a No. 1 sample and a sample made by using the second coating solution is made into a No. 2 sample.

On the other hand, a sample having a PZT thin film which does not contain Sb is prepared for comparative purposes. For this purpose, a No. 3 comparative sample is made by using the first liquid described above, that is, a coating solution for making a $PbZr_{0.52}Ti_{0.48}O_3$ (hereinafter referred to as "PZT") thin film and the same process as the process for making the above described samples for evaluation.

Next, No. 1 and No. 2 samples for evaluation and a No. 3 comparative sample made by the above-described processes are evaluated according to the following procedure. First, suppose that in No. 1 and No. 2 samples for evaluation of the embodiment and a No. 3 comparative sample, the case is such that the lower electrode is negative and the reverse case in which the upper electrode is negative. A voltage applied between the upper electrode and the lower electrode gradually changes along a pass, 0 volt→the maximum applied voltage in a positive direction $(+V_{max})$→0 volt→the maximum applied voltage in a negative direction $(-V_{max})$→0 volt and the relationship between the applied voltage (horizontal axis) and the polarization (vertical axis), that is to say, a P—V hysteresis curve was measured and the results of measurements for the No. 1 sample is shown in FIG. 2 and the results of measurements for the No. 2 sample is shown in FIG. 3.

In FIG. 2 and FIG. 3, the P—V hysteresis curves are measured on the condition that the maximum applied voltage $(+V_{max})$ in a positive direction and the $(-V_{max})$ in a negative direction were made +2 volts and −2 volts, +3 volts and −3 volts, +4 volts and −4 volts, +5 volts and −5 volts, +6 volts and −6 volts, +7 volts and −7 volts, +8 volts and −8 volts, +9 volts and −9 volts and +10 volts and −10 volts, are shown by means of $I_1$, $I_2$, $I_3$, $I_4$, $I_5$, $I_6$, $I_7$, $I_8$, and $I_9$ in order of increasing $V_{max}$. Moreover, the leakage current between the upper electrode and the lower electrode at the maximum applied voltage in a positive direction and that in a negative direction were measured when each hysteresis curve was measured.

Figure 4B:
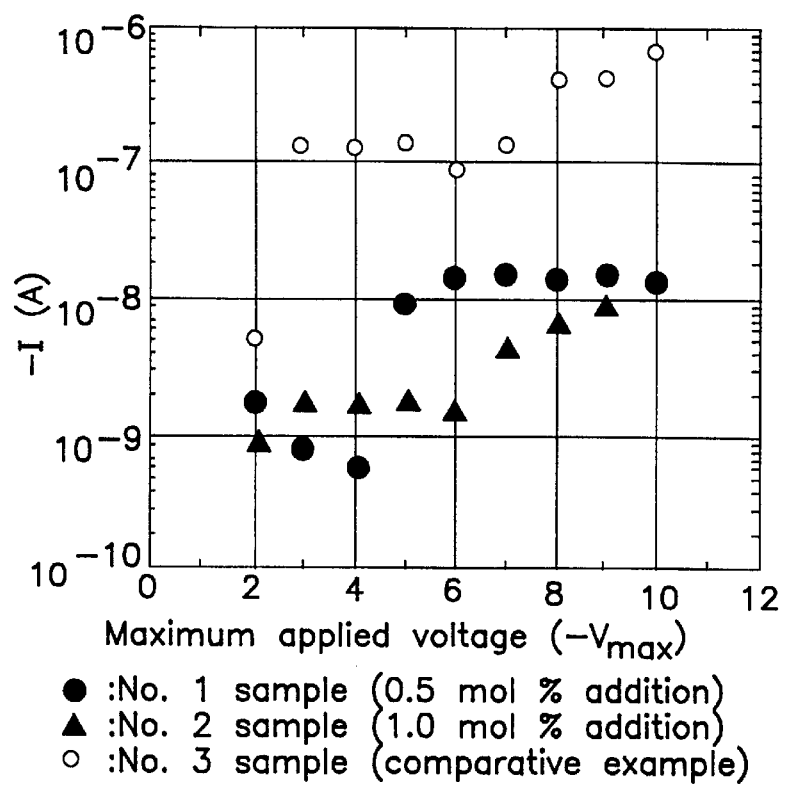
Figure 5A:
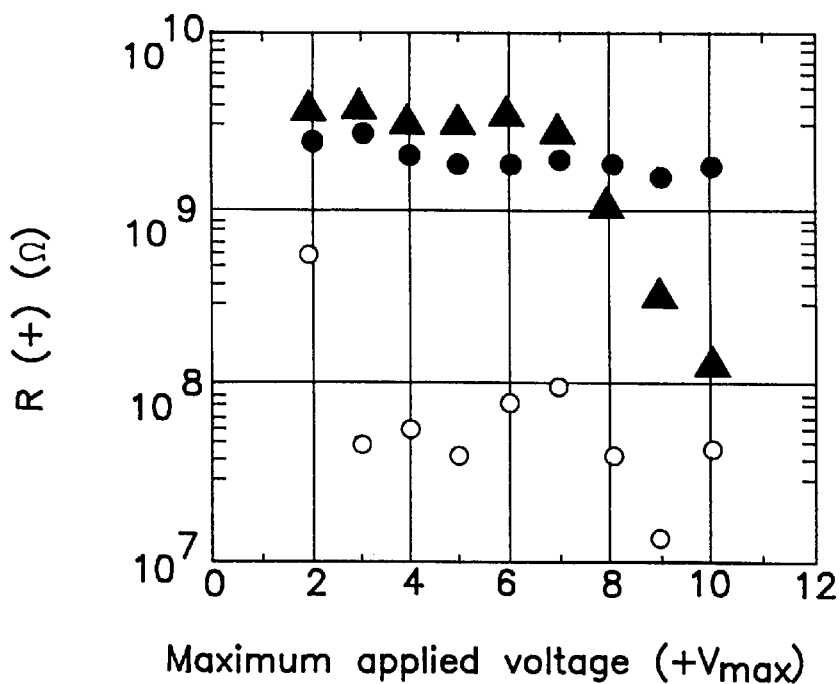
FIG. 5 shows the film resistance characteristics of the samples of the preferred embodiments and comparative sample, and (A) and (B) are film resistance characteristics corresponding to the different directions of voltage applied between an upper electrode and a lower electrode.
Figure 5B:
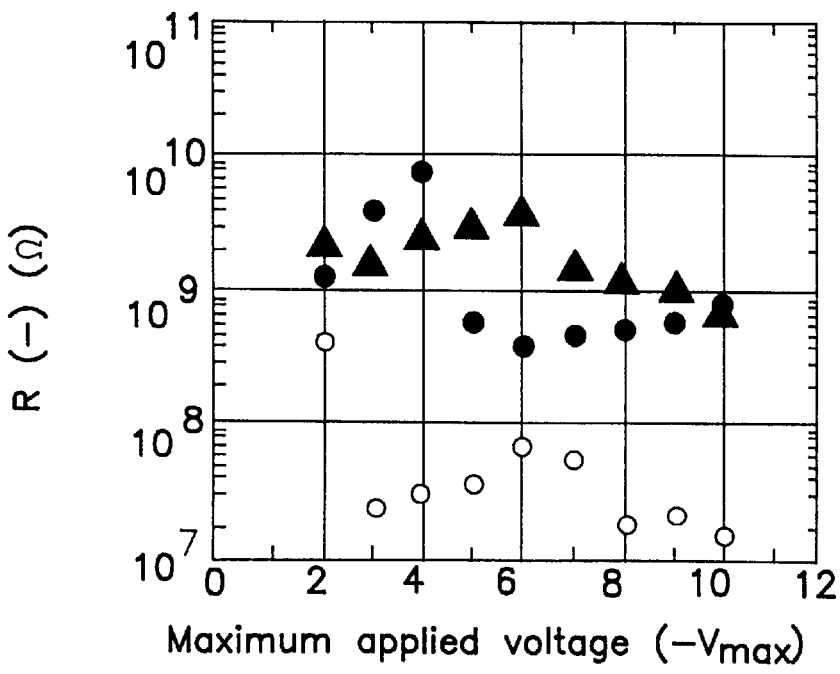

The results of the measurements are shown in FIG. 4 and FIG. 5.

FIG. 4 (A) is a diagram showing the relationship between the maximum applied voltage in a positive direction $(+V_{max})$ and the leakage current $(+I)$ measured at the maximum applied voltage in a positive direction.

FIG. 4 (B) is a diagram showing the relationship between the maximum applied voltage in a negative direction $(-V_{max})$ and the leakage current $(-I)$ measured at the maximum applied voltage in a negative direction.

Further, FIG. 5 (A) is a diagram showing the relationship between the maximum applied voltage and a film resistance $(R(+))$ calculated from the relationship of FIG. 4 (A) by using Ohm's law.

FIG. 5 (B) is a diagram showing the relationship between the maximum applied voltage and a film resistance $(R(-))$ calculated from the relationship of FIG. 4 (B) by using Ohm's law. In these drawings, the black dots (●) mean the characteristics of No. 1 sample containing Sb of 0.5 mol % based on the Pb, the black triangles (▲) mean the characteristics of No. 2 sample containing Sb of 1.0 mol % based on the Pb and the circles (○) mean the characteristics of the comparative sample.

As is evident from the hysteresis curves of the result of measurements described above, the hysteresis curve becomes more noticeable as the maximum applied voltage $|V_{max}|$ becomes larger in both cases of No. 1 sample (Sb of 0.5 mol %) and No. 2 sample (Sb of 1.0%) in FIG. 2 and FIG. 3 and it was found that the No. 1 sample and the No. 2 sample have ferroelectricity.

Referring now to the results of measurements of the leakage current shown in FIG. 4, the leakage currents of the No. 1 sample and the No. 2 sample are always made smaller than those of the No. 3 comparative sample. The leakage current of the No. 1 and No. 2 samples comes nearest to that of the No. 3 comparative sample in the positive direction of the maximum applied voltage when the maximum applied voltage is 10 volts and the leakage current of the No. 2 sample is about $7 \times 10^{-8}$ (A) at this voltage and the leakage current of the No. 3 comparative sample is about $2.5 \times 10^{-7}$ (A); therefore, the leakage current of the No. 2 sample is about ¼ times that of the No. 3 comparative sample. On the other hand, the leakage current of the No. 1 and No. 2 samples comes nearest to that of the No. 3 comparative sample in the negative direction of the maximum applied voltage when the maximum applied voltage $(-V_{max})$ is −2 volts. The leakage current of the No. 1 sample is about $2 \times 10^{-9}$ (A) at this voltage and the leakage current of the No. 3 comparative sample is about $6 \times 10^{-9}$ (A); therefore, the leakage current of the No. 1 sample is about ⅓ times that of the No. 3 comparative sample. It was found from these facts that the No. 1 sample and the No. 2 sample having Sb added therein have low leakage currents, as compared with the No. 3 comparative sample.

Next, referring to the results of the measurements of the film resistance shown in FIG. 5, the film resistance of the No. 1 and the No. 2 sample having Sb added are always larger than those of the No. 3 comparative sample. The film resistance of the No. 1 and No. 2 samples comes nearest to that of the No. 3 comparative sample in the positive direction of the maximum applied voltage when the maximum applied voltage is 10 volts and the film resistance of the No. 2 sample is about $1.5 \times 10^8$ ($\Omega$) at this voltage and the film resistance of the No. 3 comparative sample is about $4.0 \times 10^7$ ($\Omega$). That is, the film resistance of the No. 2 sample is about 4 times that of the No. 3 sample. Moreover, the film resistance of the No. 1 and No. 2 samples comes nearest to that of the No. 3 comparative sample in the negative direction of the maximum applied voltage when the maximum applied voltage is −2 volts and the film resistance of the No. 1 sample is about $1.3 \times 10^9$ ($\Omega$) at this voltage and the film resistance of the No. 3 comparative sample is about $4.0 \times 10^8$ ($\Omega$). That is, the film resistance of the No. 2 sample is about 3 times that of the No. 3 sample.

It was also found from these facts that the PZT thin film containing Sb has larger film resistance than the PZT thin film containing no Sb.

From the above experimental results, it is found that the No. 1 sample and the No. 2 sample of the embodiments indicate a lower leakage current and larger film resistance than the No. 3 comparative sample. The reason seems to be the following. Since Pb element tends to vaporize, the Pb will vaporize, particularly near the surface of the film, during the heat treatment in the process. If the Pb vaporizes from the film, the film becomes deficient in Pb so as to be a p-type film and thus possess semiconducting properties. The semiconducting properties are the reason for the increase of the leakage current of the sample. In this respect, if Sb is added according to the present invention, since Sb is trivalent and Pb bivalent, the PZT thin film is nevertheless changed into an n-type and the p-type changes caused by Pb defects is compensated for thereby increasing the insulation performance of the film.

In regard to the above, if the PZT thin film contains 0.01 mol % of Sb based upon the Pb, the film resistance of the PZT thin film becomes 2 times larger than that of the PZT thin film containing no Sb, and thus, the addition of Sb produces an improved effect. The segregation of Sb is not recognized until the Sb is 5 mol % based upon the amount of Pb. (Local segregation of Sb is not recognized). It is recommended from these facts that Sb in amounts of 0.01–5 mol % based upon the amount of Pb be added because at this ratio the Sb is not segregated. The addition of Sb thereby produces desirable effects.

Moreover, in the above described embodiment, the PZT thin film containing Sb was made on a PTO thin film. This is because the uniformity of the PZT thin film containing Sb is improved in comparison with that of the PZT thin film otherwise made. Accordingly, it is desirable that a PTO thin film be used as an underlayer when the present invention is carried out.

Although the embodiments of the present invention have been described above, it must be understood that the present invention is not to be limited to these embodiments. For instance, in the above described embodiment, the PZT thin film was described as a ferroelectric thin film containing Pb, but the present invention can be applied to various kinds of ferroelectrics in which the problem is caused by Pb loss. For example, the present invention can be applied to a ferroelectric thin film such as $PbMg_xNb_{l-x}O_3$, $Pb_5Ge_3O_{11}$, or the like.

As is evident from the above description, since a ferroelectric thin film containing Pb according to the present invention contains antimony (Sb) in such quantities as to compensate for the change of the thin film into a p-type film, caused by Pb defects produced in the thin film due to the vaporization of lead, it is possible to make a non-volatile memory of a reverse current type or an MFS-FET type which has lower leakage current than usual. Moreover, the ferroelectric thin film according to the present invention described above can be manufactured easily and at a lowered cost. Further, the ferroelectric thin film according to the present invention is suitable for wide area and mass-production.

While the present invention has been described in conjunction with the preferred embodiments thereof, it is evident that many alternatives, modifications and variations will be apparent to those skilled in the art. Accordingly, the invention is intended to embrace all such alternatives, modifications, and variations that fall within the spirit and broad scope of the appended claims.

What is claimed is:

1. A method for making a ferroelectric thin film containing lead (Pb) on a substrate by means of a wet method, comprising the following steps:

adding to a coating solution to be used for producing a ferroelectric thin film, antimony (Sb) in such a quantity to compensate for a change of a thin film into a p-type caused by Pb defects generated in said thin film, and forming said ferroelectric thin film containing lead on a substrate by using said coating solution containing Sb.

2. A method for making a ferroelectric thin film as claimed in claim 1, wherein said process comprises:

(a) applying said coating solution containing Sb on a substrate by means of a spin coating step, (b) drying said coated layer made by said coating process to produce a dried coating layer, (c) subjecting the dried coated layer to a prebaking step to prebake said dried coated layer, and (d) subjecting said prebaked layer to a baking step to bake said prebaked layer.

3. A method for making a ferroelectric thin film as claimed in claim 2, wherein said substrate is rotated at a low speed of rotation in an initial stage of said coating process and is rotated at a high speed of rotation in a remaining stage of said coating process.

4. A method for making a ferroelectric thin film as claimed in claim 2, wherein a cycle of said coating process, said drying process, and said prebaking process is repeated a plurality of times.

5. A method for making a ferroelectric thin film as claimed in claim 1, wherein said coating solution containing Sb is a mixed liquid of the first liquid containing $Pb(Zr_{0.52}Ti_{0.48})O_3$ and the second liquid containing Sb in a form of Pb—O—Sb metalloxy bond.

6. A method for making a ferroelectric thin film as claimed in claim 1, wherein said quantity of antimony added previously is in a range of 0.01–5 mol % based upon lead.

7. A method for making a ferroelectric thin film as claimed in claim 1, wherein ferroelectric thin film is a PbZrTiSbO thin film.

8. A method for making a ferroelectric thin film as claimed in claim 6, wherein ferroelectric thin film is a PbZrTiSbO thin film.

9. A method for making a ferroelectric thin film as claimed in claim 1, wherein a lead titanate ($PbTiO_3$) thin film is first formed on a substrate and then said ferroelectric thin film is formed on said lead titanate thin film.

10. A method for making a ferroelectric thin film as claimed in claim 6, wherein a lead titanate ($PbTiO_3$) thin film is first formed on a substrate and then said ferroelectric thin film is formed on said lead titanate thin film.

11. A method for making a ferroelectric thin film as claimed in claim 7, wherein a lead titanate ($PbTiO_3$) thin film is first formed on a substrate and then said ferroelectric thin film is formed on said lead titanate thin film.

* * * * *